(12) United States Patent
Nogami

(10) Patent No.: US 6,245,396 B1
(45) Date of Patent: *Jun. 12, 2001

(54) CVD APPARATUS AND METHOD OF USING SAME

(75) Inventor: Hiroshi Nogami, Tokyo (JP)

(73) Assignee: Anelva Corporation, Fuchu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,852

(22) Filed: Feb. 23, 1999

(30) Foreign Application Priority Data

Feb. 26, 1998 (JP) .................................... 10-062066
Feb. 1, 1999 (JP) .................................... 11-023887

(51) Int. Cl.$^7$ .................................... C23C 16/50

(52) U.S. Cl. .................... 427/562; 427/563; 118/723 ER

(58) Field of Search .................. 118/723 MR, 723 ER; 427/562, 563

(56) References Cited

U.S. PATENT DOCUMENTS 5,433,787 * 7/1995 Suzuki ........................ 118/723 ER
5,449,410 * 9/1995 Chang ........................ 118/723 ER

OTHER PUBLICATIONS

A new technique for diagnostics of a radio–frequency parallel–plate remote plasma; N. Sano et al.; Appl. Phys. Lett 65 (2), Jul. 11, 1994 pp. 162–164.
Infrared spectroscopic study of $SiO_x$ films produced by plasma enhanced chemical vapor deposition; J. Vac.Sci. Technol. A4(3), May/Jun. 1986; pp. 689–694.
Improvement of structural and electrical properties in low-temperature gate oxides for poly–Si TFTs by controlling $O_2/SiH_4$ ratios; AM–LCD 1997; pp. 87–90.
"Lennard–Jones Potentials as Determined from Viscosity Data (Appendix B)", *The Properties of Gases and Liquids*, McGraw–Hill, Inc., 1987.
"Diffusivity and Mechanisms of Mass Transport: Theory of Ordinary Diffusion in Gases at Low Density". *Transport Phenomena*, John Wiley & Sons, Inc., 1960, p. 508–513 and table B–2.

* cited by examiner

Primary Examiner—Richard Bueker
(74) Attorney, Agent, or Firm—Burns, Doane, Swecker & Mathis, LLP

(57) ABSTRACT

To suppress the formation of dust particles, prevent the implantation of ions into a substrate and to achieve a good plasma distribution in the vicinity of the substrate when depositing a silicon oxide film using TEOS, for example, by means of CVD on a substrate which has a large surface area, an apparatus in which plasma is generated in the reactor 12 and active species (radicals) are formed and film deposition is carried out on the substrate 11 with this active species and precursor gas in which a partitioning plate 15 in which a plurality of holes 22 has been formed is established. The reactor is divided into a plasma generating space 16 and a film deposition process space 17, in which the precursor gas is delivered directly into the film deposition process space 17 through a plurality of pathways which is established dispersed over and passing through the plasma generating space and the partitioning plate, and the active species which are formed in the plasma generating space are delivered into the film deposition process space through the plurality of holes which are established in the partitioning plate.

10 Claims, 4 Drawing Sheets

CVD APPARATUS AND METHOD OF USING SAME

BACKGROUND OF THE INVENTION

1. Field of the Invention

The present invention concerns CVD apparatus, and in particular CVD apparatus which use plasma and which are suitable for depositing films on large flat panel substrates.

2. Discussion of Related Art

The use of high temperature polysilicon type TFT (thin film transistors) and the use of low temperature polysilicon type TFT were known in the past as methods for the production of liquid crystal displays. A quartz substrate which can withstand high temperatures of 1,000 C or above is used for obtaining a high quality oxide film and oxide film interface with polysilicon in the method of production where high temperature polysilicon type TFT is used. On the other hand, a glass substrate as generally used for a TFT is used in the production of low temperature polysilicon type TFT liquid crystal display and so film deposition must be carried out in a low temperature environment, such as at 400 C. The production of liquid crystal displays using low temperature polysilicon type TFT has the advantages of not requiring the use of a special substrate and so this method has come into practical use in recent years and the amount of production continues to expand.

Plasma enhanced CVD is used in those cases where an appropriate silicon oxide film is deposited at a low temperature as a gate insulating film in the production of a liquid crystal display using low temperature polysilicon type TFT. Silane and tetraethoxysilane (referred to hereinafter as TEOS) are used as precursor gases when depositing silicon oxide films using plasma enhanced CVD.

When a silicon oxide film is deposited using plasma enhanced CVD with TEOS as the precursor gas, the precursor gas is delivered directly into the plasma which is formed in a conventional plasma processing apparatus. The precursor gas and oxygen react vigorously and the reaction product is formed in the gas phase. The reaction product forms dust particles which cause the formation of defects in the TFT elements. There is a problem in that the yield is reduced by the formation of dust particles. Moreover, there is also a problem in that the film properties are adversely affected by the implantation in the silicon oxide film of the high energy ions which are present in the plasma which is in contact with the substrate.

Plasma enhanced CVD apparatus in which a remote plasma system is used has been suggested in the past as a means of resolving the abovementioned problems. In a remote plasma system, the region in which the plasma is generated and active species such as radicals are formed is separated from the substrate in the plasma processing apparatus and the precursor gas is delivered close to the region in which the substrate is disposed. The radicals which are formed in the plasma region are diffused toward the region in which the substrate has been disposed and reach the space in front of the surface of the substrate which is being processed. The vigorous reaction between the plasma and the precursor gas is suppressed in a plasma processing apparatus of the remote plasma system and there is little dust particle formation, and there is a further advantage in that the implantation of ions into the substrate is also suppressed.

However, the plasma generating region and the region in which the substrate is disposed are formed separately with an intervening Joining space in a plasma processing apparatus of the remote plasma system. The radicals which are produced at a location remote from the substrate are delivered to the substrate by a diffusion process through the joining space. The rate of film deposition is reduced in a remote plasma system and there is a further problem in that the distribution in the vicinity of the substrate surface is poor. In particular, problems arise in that the system cannot be applied to the substrates which have a large surface area which are used for large liquid crystal displays because of the poor distribution in the vicinity of the substrate surface.

OBJECTS AND SUMMARY

An aim of this invention is to resolve the problems referred to above and to provide a CVD apparatus which can be used effectively for the deposition of films on substrates which have a large surface area while suppressing the formation of dust particles, preventing the implantation of ions into the substrate and providing a good plasma distribution in the vicinity of the substrate when depositing silicon oxide films using a precursor gas such as TEOS in CVD with large area substrates in the production of large liquid crystal displays in which low temperature polysilicon type TFT are used.

In order to realize the aforementioned aims, a CVD apparatus has a reactor in which plasma is generated, and active species (radicals) are formed and a film deposition process is carried out on a substrate with these active species and a precursor gas. The CVD apparatus has a partitioning plate in which a plurality of holes are formed. The partitioning plate divides the reactor into a plasma generating space and a film deposition process space. The precursor gas which is delivered to the reactor is passed through the plasma generating space and the partitioning plate and conducted and dispersed directly into the film deposition process space through a plurality of electrically conductive pathways. The active species which have been formed in the plasma generating space pass through the plurality of holes which are formed in the partitioning plate and are delivered into the film deposition process space. The precursor gas is delivered directly into the film deposition process space in front of the substrate, avoiding the region in which the plasma is being generated. By this means the occurrence of a vigorous chemical reaction between the precursor gas and the plasma is prevented and the formation of dust particles is suppressed.

The holes which are formed in the partitioning plate satisfy the condition that $uL/D>1$, where $u$ is the flow rate of reaction gas (oxygen) in the holes, $L$ is the characteristic length of the holes and $D$ is the binary diffusivity (which is to say the binary diffusion constant of oxygen gas and the precursor gas). This condition is set so that if it is assumed that the reaction gas (oxygen gas) is passing through the holes by convection and the precursor gas is migrating to the other side by diffusion, the extent of the migration of the precursor gas by diffusion is suppressed.

The partitioning plate is connected to an RF power supply which provides RF power for cleaning purposes. Plasma for cleaning purposes is generated in the film deposition process space by supplying RF power to the partitioning plate at a suitable time.

A gas reservoir which is furnished with an equalizing plate is established on the entry port side of the plurality of pathways. The precursor gas which is being delivered into the film deposition process space is caused to diffuse and equalized out so that a film can be deposited on a substrate which has a large surface area.

Plasma is generated in the spaces between a discharge electrode and the partitioning plate and the top plate which form the plasma generating space by establishing the electrode at an intermediate position within the plasma generating space.

Plasma is generated between the discharge electrode and the partitioning plate by establishing the electrode in a position in the upper part of the plasma generating space.

A method of film deposition in a CVD apparatus involves carrying out film deposition on a substrate with a precursor gas and an active species which has been formed by a plasma. The reactor is divided into a plasma generating space and a film deposition process space by a partitioning plate in which a plurality of holes have been formed. The precursor gas which is delivered to the reactor is introduced directly into the film deposition process space. The active species which have been formed from the reaction gas in the plasma generating space pass through a plurality of holes which have been formed in the partitioning plate and are introduced into the film deposition process space.

The plurality of holes which have been formed in the partitioning plate satisfy the condition that uL/D>1, where u is the flow rate of reaction gas in the holes, L is the characteristic length of the holes and D is the binary diffusivity.

Cleaning of the film deposition process space is preferably carried out at suitable times by supplying RF power to the partitioning plate and generating plasma in the film deposition process space.

DETAILED DESCRIPTION OF THE PREFERRED EMBODIMENTS

Preferred embodiments of the invention are described below with reference to the attached drawings.

Figure 1:
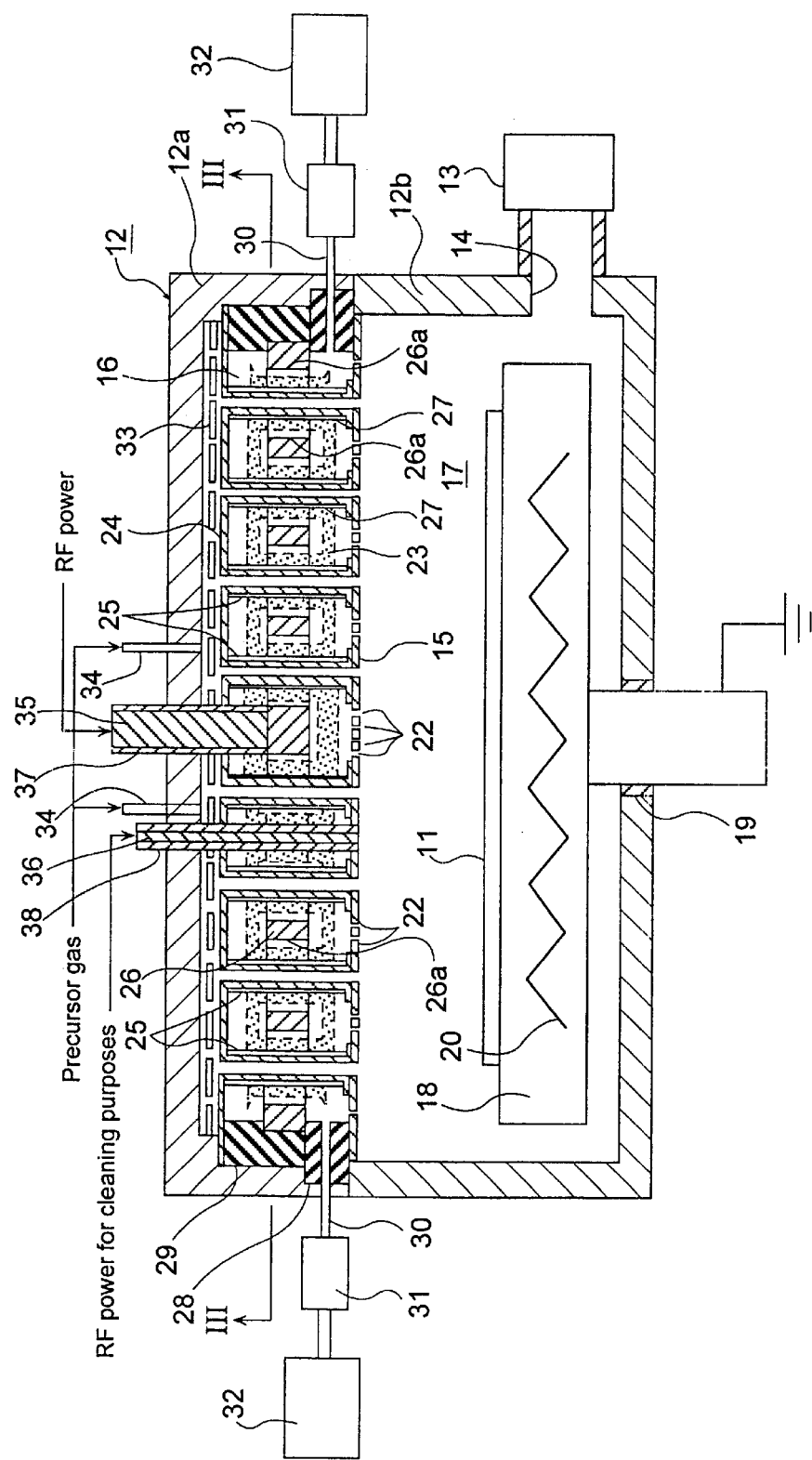
FIG. 1 is a cross sectional view of a first embodiment of the invention.
Figure 2:
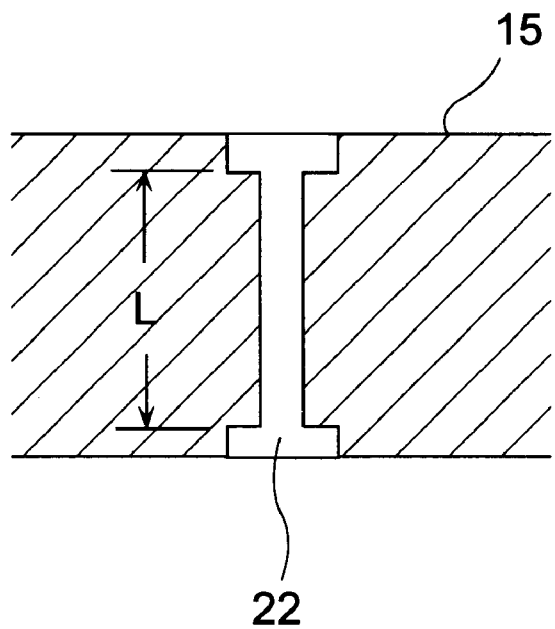
FIG. 2 is an enlarged cross sectional drawing of a hole which has been formed in the partitioning plate.

A first embodiment of CVD apparatus of this invention is described with reference to FIGS. 1 to 3. In FIG. 1, a silicon oxide film is deposited on an upper surface of a glass substrate 11 as a gate insulating film for general TFT purposes using TEOS as the precursor gas in the CVD apparatus.

The reactor 12 of the CVD apparatus is maintained in the prescribed vacuum state by the pumping mechanism 13 when film deposition is being carried out. The pumping mechanism 13 is connected to the pumping port 14 of the reactor 12. The reactor 12 is divided into a plasma generating space 16 on the upper side and a film deposition process space 17 on the lower side by means of a partitioning plate 15 which is made of an electrically conductive material. A glass substrate 11 is disposed on a substrate support mechanism 18 which is established in the film deposition process space 17. The glass substrate 11 is disposed in such a way that it is essentially parallel with the partitioning plate 15 with the surface on which the film is to be deposited facing the bottom surface of the partitioning plate 15. The substrate support mechanism 18 is held at the same potential as the reactor 12, and is maintained at ground potential. A heater 20 is established within the substrate support mechanism 18. The temperature of the glass substrate 11 is maintained at a fixed temperature by means of this heater 20.

As shown in the drawing, the reactor 12 is divided regionally into the plasma generating space 16 and the film deposition process space 17 by means of the partitioning plate 15. A plurality of through-holes 22 is established in a dispersed manner in the partitioning plate 15. The plasma generating space 16 and the film deposition process space 17 are connected by means of this plurality of holes 22. An enlarged cross sectional view of a hole 22 is shown in FIG. 2. The conditions which the holes 22 satisfy are described hereinafter.

The construction of the reactor is described in more detail below. From the viewpoint of the ease of assembly, the reactor 12 is constructed from an upper container 12a which forms the plasma generating space 16 and a lower container 12b which forms the film deposition process space 17. When assembling the upper container 12a and the lower container 12b to form the reactor 12, the partitioning plate 15 and the parts associated therewith are sandwiched between the two. The assembly of these parts defines the plasma generating space 16 and the film deposition process space 17. The plasma generating space 16 is defined by the partitioning plate 15 and the parts associated therewith and the above-mentioned upper container 12a. As shown in the drawing, the region in which the plasma 23 is generated is formed from the partitioning plate 15, an upper wall plate 24 which is made of an electrically conductive material, a plurality of pipes 25 which are connected thereto and an electrode 26 which is disposed in a central position. The partitioning plate 15 and the upper wall plate 24 are disposed parallel to one another and connected by the plurality of pipes 25. The plurality of pipes 25 which connect the partitioning plate 15 and the upper wall plate 24 function as pathways through which the precursor gas passes. The space on the upper side of the upper wall plate 24 and the space on the lower side of the partitioning plate 15, i.e., the film deposition process space 17, are inter-connected. The pipes 25 are formed with an electrically conductive material and their outer surfaces are fitted with ceramic covers 27. The partitioning plate 15, the electrode 26 and the upper wall plate 24 are supported by means of two ring-shaped insulating parts 28 and 29 which are established along the inner surface of the side parts of the upper container 12a. A delivery pipe 30 for delivering oxygen gas from the outside into the plasma generating space 16 is established in the ring-shaped insulating part 28. The delivery pipe 30 is connected to the oxygen gas source 32 via the mass flow controller 31 which controls the mass flow rate.

Figure 3:
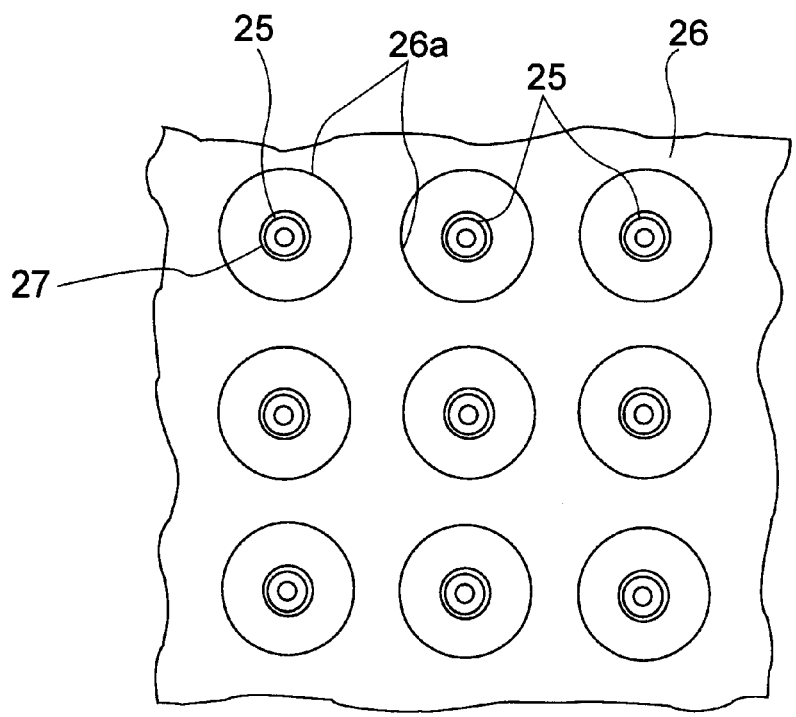
FIG. 3 is a partial cross sectional view of the discharge electrode viewed along the line III—III in FIG. 1.

A plane view of a part of an electrode is shown in FIG. 3. A plurality of holes 26a is formed in the electrode 26. The pipes 25 are disposed in the holes 26a.

A gas reservoir which is equipped with an equalizing plate 33 is established between the upper wall plate 24 and the ceiling of the upper container 12a. The equalizing plate 33 is a plate in which a plurality of holes has been formed uniformly. A delivery pipe 34, which delivers the precursor gas, is established in the ceiling of the upper container 12a. The precursor gas is delivered into the gas reservoir of the reactor 12 by means of the delivery pipe 34. Moreover, the electrical power conductor rod 35, which is connected to the electrode 26, and the electrical power conductor rod 36, which is connected to the partitioning plate 15, are established in the ceiling of the upper container 12a. RF power for discharge purposes is supplied to the electrode 26 by means of the electrical power conductor rod 35. RF power for cleaning purposes is supplied to the partitioning plate 15 by means of the electrical power conductor rod 36. The electrical power conductor rods 35 and 36 are covered with insulating materials 37 and 38 respectively and insulated from the other metal parts.

Film deposition with CVD apparatus of this type is described below. The glass substrate 11 is transferred into the reactor 12 by means of a transfer robot which is not shown in the drawings and disposed on the substrate support mechanism 18. The reactor 12 is pumped out by means of the pumping mechanism 13 and the pressure is reduced and maintained at the prescribed vacuum state. Next, oxygen gas is delivered through the delivery pipe 30 into the plasma generating space 16 of the reactor 12. The mass flow rate of the oxygen gas at this time is controlled by means of the external mass flow controller 31. Oxygen flow velocity (u) is determined in accordance with the following equations (1) and (2), based on oxygen gas flow rate ($Q_{O2}$), pressure ($P_{O_2}$) in film deposition process space, and temperature (T) of partitioning plate.

$$Q_{O_2} = S_{O_2} u A \tag{1}$$

$$P_{O_2} = S_{O_2} RT/M \tag{2}$$

Where $S_{O_2}$: Density of oxygen gas (kg/m$^3$)

M: Molecular weight of oxygen gas

T: Absolute temperature

A: Total cross sectional area of the holes 22 formed in the partitioning plate 15 u: Flow velocity of the oxygen gas flowing through the holes 22

R: The gas constant

On the other hand, the precursor gas, TEOS, is delivered into the reactor 12 through the delivery pipe 34. The TEOS is delivered into the gas reservoir initially where it is evened out by means of the equalizing plate 33 and then it is delivered directly into the film deposition process space 17 through the plurality of pipes 25. Power is supplied to the heater 20 of the substrate support mechanism 18 which is established in the film deposition process space 17 and it is maintained at a predetermined temperature.

RF power is supplied to the electrode 26 by way of the electrical power conductor rod 35. A discharge is produced by the RF power and an oxygen plasma 23 is generated around the electrode 26 in the plasma generating space 16. The production of the oxygen plasma 23 results in the formation of radicals which are neutral active species (excited active species). When TEOS is delivered to the reactor 12 the TEOS does not come into direct contact with the oxygen plasma 23. The TEOS which has been delivered does not react vigorously with the oxygen plasma.

The CVD apparatus of this embodiment has the reactor 12 divided into a plasma generating space 16 and a film deposition process space 17 by means of the partitioning plate 15. The CVD apparatus is such that oxygen gas is delivered into the plasma generating space 16, RF power is supplied to the electrode 26 and the oxygen plasma 23 is generated. On the other hand, the CVD apparatus is such that the TEOS is delivered directly into the film deposition process space 17. Assuming that mass transfer flow of the oxygen gas from the plasma generating space 16 into the film deposition process space 17 and diffusion transfer of TEOS from the film deposition process space 17 into the plasma generating space 16 take place through the holes 22 penetrating the partitioning plate 15, the form of the holes 22 is so determined that the ratio of the rate of the mass transfer flow to the rate of the diffusion transfer is higher than the predetermined value. More specifically, the holes 22 are so designed as to meet the condition of uL/D>1, where D represents the binary diffusivity as obtained when the partitioning plate temperature is T while the pressure in the film deposition process space is $P_{O2}$, and L represents the length of the part of the hole 22 with minimum diameter, i.e., characteristic length of the hole 22, as shown in FIG. 2.

The condition of uL/D>1 is derived as follows. In connection with the transfer of oxygen and TEOS via the through-holes 22, the following equation (3) is established based on the TEOS gas density ($S_{TEOS}$), diffusion flow velocity ($U_{TEOS}$) and the binary diffusion coefficient ($D_{TEOS-O2}$). The equation (3) can be approximated by an equation (4). A comparison between both sides of the equation (4) proves that the diffusion flow velocity ($U_{TEOS}$) of TEOS can be expressed by $-DTEOS-O_2/L$. Therefore, representing the oxygen flow velocity as obtained from the foregoing equations (1) and (2) by u and the diffusion velocity of TEOS by $-DTEOS-O_2$, the ratio between the absolute values of these two velocity values, i.e., $|-u/(-D_{TEOS}-O_2/L)|=uL/D_{TEOS}-O_2$ amounts to the ratio between the oxygen velocity and the TEOS diffusion velocity. Value of this ratio uL/DTEOS-$O_2$ exceeding 1 means that the flow rate due to convection is greater than the flow rate caused by diffusion, i.e., that the influence of diffusion of TEOS is not significant.

$$S_{TEOS} u_{TEOS} = -D_{TEOS-2} grad_{TEOS} \tag{3}$$

$$S_{TEOS} u_{TEOS} \sim -D_{TEOS-2} S_{TEOS}/L \tag{4}$$

The plasma generating space 16 and the film deposition process space 17 are separated by the partitioning plate 15 in which a plurality of holes 22 which satisfy the abovementioned condition has been formed. The holes 22 which satisfy the abovementioned condition minimize contact between the TEOS which is delivered directly into the film deposition process space 17 and the oxygen plasma. The holes 22 which satisfy the abovementioned condition prevent the vigorous reaction between the TEOS and oxygen plasma which takes place in conventional apparatus.

The quantity of radicals required to achieve CVD film deposition on the glass substrate from among those which have been produced in the plasma generating space 16 migrate by convection through the holes 22 which have been formed in the partitioning plate 15 into the film deposition process space 17. The TEOS is activated as radicals by these radicals and a film of silicon oxide ($SiO_2$) is deposited on the surface of the glass substrate 11.

An actual example is described below. When the diameter of the holes 22 in the partitioning plate 15 was 0.5 mm, the total number of holes 22 was 1,800, the mass flow of oxygen gas was 500 sccm (representing the volume flow rate (cc/min) at 0 C, 1 atmosphere pressure, with $Q_{O_2}$=1.19×10$^{-5}$ (kg/s)), the temperature of the partitioning plate was about 200 C, the pressure in the film deposition process space 17 was 100 Pa, the length of parts of diameter 0.5 mm (L) was 3 mm and the binary diffusion coefficient was 0.0225 m$^2$/s, then u was 41.3 m/s from $S_{O_2}$=8.16×10$^{-4}$ (kg/m$^3$) and A=3.53×10$^{-4}$ (m$^2$), and so the value of the aforementioned equation (4) was 5.5. In such a case the migration by convection of oxygen gas predominates over the migration by diffusion of TEOS. There is little diffusion of TEOS into the plasma generating space 16 which is filled with the oxygen plasma 23 and, as a result, there is little dust particle formation.

Cleaning of the film deposition process space 17 is described below. There is a problem with the CVD apparatus of this embodiment in that the plasma does not diffuse satisfactorily into the film deposition process space 17 and so it is difficult to clean the film deposition process space 17. The electrical power conductor rod 36 is connected electrically to the partitioning plate 15. Thus it is possible to generate $NF_3$ plasma, for example, in the film deposition process space 17 by supplying RF power to the partitioning plate 15. The interior of the film deposition process space 17 can be cleaned with the plasma so generated. The timing with which RF power is supplied to the electrical power conductor rod 36 and cleaning is carried out is arranged so that cleaning is carried out at suitable times, either at pre-determined fixed intervals or after processing a fixed number of substrates for example.

Figure 4:
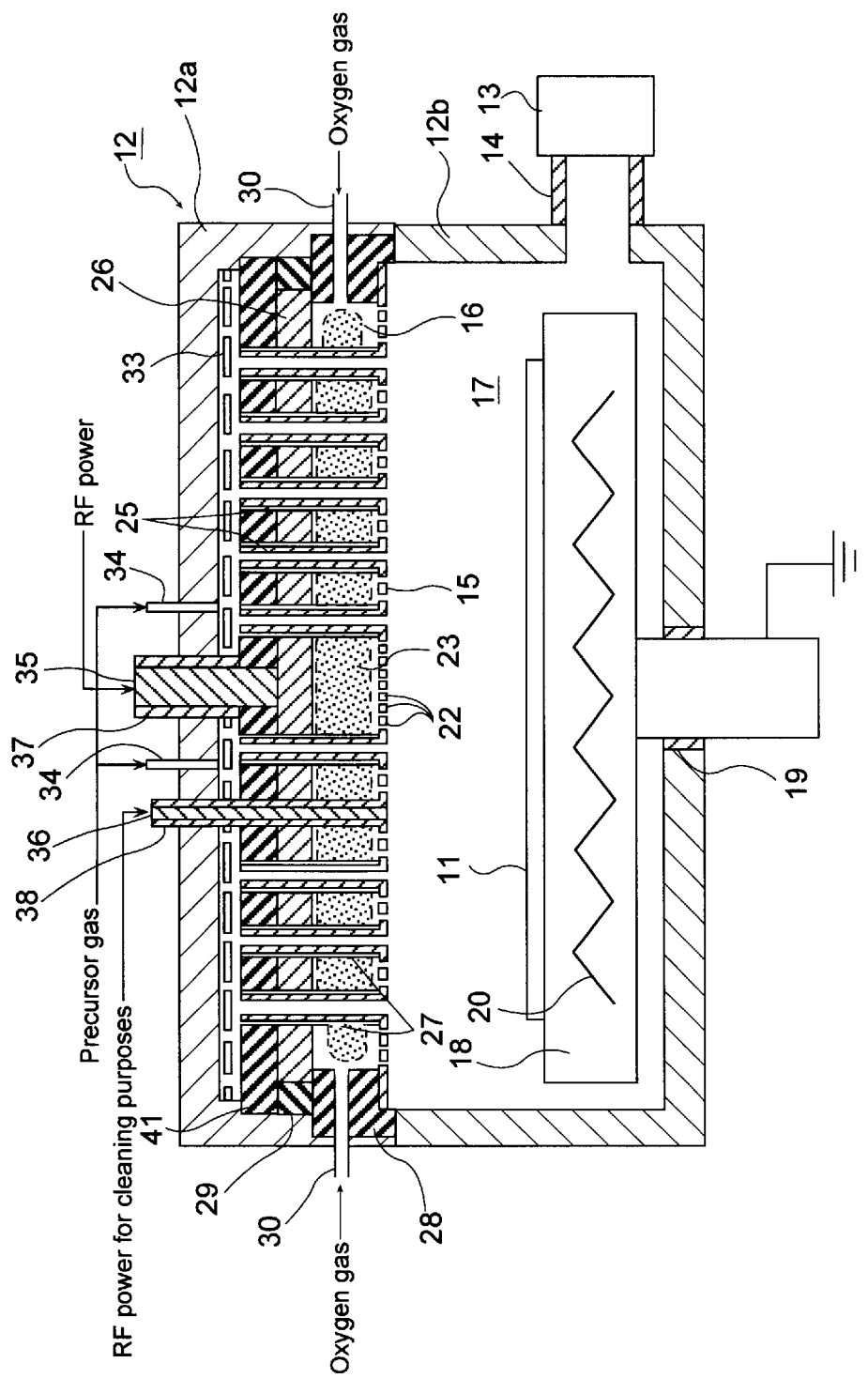
FIG. 4 is a cross sectional drawing of a second embodiment of the invention.

A second embodiment of CVD apparatus of this invention is described below with reference to FIG. 4. In FIG. 4 the same symbol is attached to elements which are essentially similar to those described in FIG. 1, and repetition of a detailed description of these elements is omitted. The distinguishing features of the structure of this embodiment are that the upper wall plate 24 described earlier is missing, a circular plate-like insulating part 41 is established in the top part and the electrode 26 is disposed on the lower side of the insulating part 41. A parallel flat plate plasma generating space 16 is formed by the electrode 26 and the partitioning plate 15. The plurality of pipes 25 which form the pathways for the precursor gas is established between the insulating part 41 and the partitioning plate 15. The remainder of the construction is essentially the same as that of the first embodiment. Moreover, the action and effect of the CVD apparatus in the second embodiment are the same as in the first embodiment described above.

TEOS has been used as the precursor gas in the embodiments described above, but the precursor gas is not limited to TEOS and, of course, other precursor gasses could be used. The principle idea of the invention applies to all processing where the formation of dust particles as a result of contact between plasma and a precursor gas and the implantation of ions into the substrate create problems, and it can be applied to film deposition, surface processing and isotropic etching, for example.

As is clear from the description above, the plasma generating space and the film deposition process space are separated by a partitioning plate in which through holes which satisfy the condition that migration by convection predominates have been formed. The precursor gas is delivered directly to the film deposition process space and does not make contact with the plasma. A vigorous chemical reaction between the precursor gas and the plasma can be prevented and, as a result, the formation of dust particles is suppressed, and it is possible to prevent the implantation of ions into the substrate.

A plurality of pathways for the delivery of precursor gas directly into the film deposition process space is established and a gas reservoir which is furnished with an equalizing plate is established on the up-stream side of these pathways. The precursor gas can be delivered evenly into the film deposition process space and radicals can also be supplied evenly to the film deposition process space by means of the plurality of holes which are formed in the partitioning plate. By this means the plasma distribution in the vicinity of the substrate surface is improved and film deposition can be carried out effectively on a substrate which has a large surface area.

An electrical power conductor rod for cleaning purposes is fitted to the partitioning plate. Power is supplied with suitable timing so that cleaning is carried out. Even though the plasma generating space and the film deposition process space are separated by the partitioning plate it is possible to maintain the appropriate level of cleanliness in the film deposition process space.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A CVD apparatus, comprising:
a reactor in which plasma is generated and active species are formed and film deposition is carried out on a substrate with the active species and a precursor gas;
a partitioning plate in which a plurality of holes has been formed is arranged in the reactor to define a plasma generating space and a film deposition process space;
means for supplying the precursor gas to the reactor; and
a plurality of electrically conductive pathways passing through the plasma generating space and the partitioning plate for delivering the precursor gas directly into the film deposition process space;
wherein the active species which are produced in the plasma generating space are delivered into the film deposition process space through the plurality of holes which is formed in the partitioning plate.

2. The CVD apparatus as claimed in claim 1, wherein in each of the plurality of holes which is formed in the partitioning plate, the gas flow rate in the hole is u, the effective hole length is L, and the binary diffusivity is D, and the condition uL/D>1 is satisfied.

3. The CVD apparatus as claimed in claim 1, wherein the partitioning plate is connected to an RF power supply which supplies RF power for cleaning purposes.

4. The CVD apparatus as claimed in claim 1, further comprising an equalizing plate provided in a gas reservoir.

5. The CVD apparatus as claimed in claim 1, further comprising an electrode for discharge purposes in an intermediate position in the plasma generating space, wherein plasma is generated between the electrode and the partitioning plate and upper wall plate.

6. The CVD apparatus as claimed in claim 1, further comprising an electrode for discharge purposes in a position on an upper side in the plasma generating space, wherein plasma is generated between the electrode and the partitioning plate.

7. A method of film deposition in a CVD apparatus having a reactor, a partitioning plate in which a plurality of holes has been formed and which is arranged in the reactor to define a plasma generating space and a film deposition process space, and a plurality of pathways which are established through the plasma generating space and the partitioning plate, comprising the steps of:
supplying a precursor gas to the reactor;
passing the precursor gas through the plurality of pathways directly into the film deposition process space;
generating plasma and forming active species in the plasma generating space;
delivering the active species which are produced in the plasma generating space into the film deposition process space through the plurality of holes which is formed in the aforementioned partitioning plate, wherein the precursor gas is kept substantially separate from the active species during passage through the plasma generation space; and carrying out film deposition on a substrate with the active species and the precursor gas in the film deposition process space.

8. The method of claim 7, wherein in each of the plurality of holes which is formed in the partitioning plate, the gas flow rate in the hole is u, the characteristic hole length is L, and the gas binary diffusivity is D, and the condition uL/D>1 is satisfied.

9. The method of claim 7, in which the partitioning plate is connected to an RF power supply which supplies RF power for cleaning purposes, and supplying RF power with suitable timing to the partitioning plate to generate plasma for cleaning purposes.

10. A method of film deposition in a CVD apparatus having a reactor, a partitioning plate in which a plurality of holes has been formed and which is arranged in the reactor to define a plasma generating space and a film deposition process space, and a plurality of pathways which are established through the plasma generating space and the partitioning plate, comprising the steps of:

supplying a precursor gas to the reactor;

passing the precursor gas through the plurality of pathways directly into the film deposition process space;

generating plasma and forming active species in the plasma generating space;

delivering the active species which are produced in the plasma generating space into the film deposition process space through the plurality of holes which is formed in the aforementioned partitioning plate, wherein the precursor gas is kept substantially separate from the active species during passage through the plurality of pathways; and carrying out film deposition on a substrate with the active species and the precursor gas in the film deposition process space.

* * * * *